United States Patent [19]

Shook

[11] Patent Number: 5,152,056

[45] Date of Patent: Oct. 6, 1992

[54] METHOD FOR REPLACING TAPE AUTOMATED BONDING COMPONENTS ON A PRINTED CIRCUIT BOARD

[75] Inventor: Gill Shook, Santa Cruz, Calif.

[73] Assignee: Sun Microsystems, Inc., Mountain View, Calif.

[21] Appl. No.: 750,820

[22] Filed: Aug. 27, 1991

[51] Int. Cl.⁵ .......................................... H05K 3/34
[52] U.S. Cl. ...................................... 29/840; 29/827;
357/70; 437/209; 439/876
[58] Field of Search .................... 29/827, 840; 357/70;
437/209; 439/876

[56] References Cited

U.S. PATENT DOCUMENTS

| | | | |
|---|---|---|---|
| 4,038,744 | 8/1977 | Cheype et al. | 29/827 |
| 4,531,285 | 7/1985 | Lucas | 29/827 |
| 4,835,847 | 6/1989 | Kamperman | 29/827 X |
| 4,908,337 | 3/1990 | Treffer | 29/827 X |
| 5,034,591 | 7/1991 | Fang | 29/827 X |
| 5,056,217 | 10/1991 | Yamazaki et al. | 29/827 X |
| 5,057,461 | 10/1991 | Fritz | 29/827 X |

Primary Examiner—Carl J. Arbes
Attorney, Agent, or Firm—Blakely, Sokoloff, Taylor & Zafman

[57] ABSTRACT

New standard industrial grade solder is first applied to leads of a tape automated bonding (TAB) component of a printed circuit board (PCB) to be replaced, which was previously bonded using standard industrial grade solder. The new and old solder are melted at the same time. The TAB component is removed without removing all the melted new solder. After applying flux to the solder pads, a replacement TAB component is placed onto the TAB component site. Heat and pressure are applied to leads of the replacement TAB component at the same time while the replacement TAB component is being placed onto the TAB component site. Pressure is maintained until the leads and the remaining new solder have cooled below the solder's melting temperature. As a result, the replacement TAB component is connected to the PCB replacing the removed TAB component with reduced number of steps and cycle time for the steps, thereby reducing opportunities to damage the PCB.

9 Claims, 3 Drawing Sheets

METHOD FOR REPLACING TAPE AUTOMATED BONDING COMPONENTS ON A PRINTED CIRCUIT BOARD

BACKGROUND OF THE INVENTION

1. Field of the Invention

The present invention relates to the field of printed circuit board (PCB). In particular, the present invention is a method for replacing a tape automated bonding (TAB) component on a PCB.

2. Art Background

Traditionally, a TAB component is removed from a PCB by melting the solder applied to the TAB component's leads, and providing a lifting force after the solder has been melted. Typically the solder is composed of approximately 63% Tin and 37% Lead. The solder is melted by applying heat via hot gas or a hot bar. The remaining solder on the solder pads is removed by "wicking" solder away from the solder pads. Typically, the remaining solder is "wicked" using a "solder wick" product having a copper mesh wire with flux. Heat is applied in conjunction with the copper mesh wire to "wick" the remaining solder into the copper braid.

New solder is then applied to the solder pads by melting wire solder and moving a solder iron between the solder pads. Uneven solder is reheated with a sweeping motion using the solder iron until the new solder is uniform. The newly applied solder is allowed to cool below its melting temperature. The replacement TAB component is placed in position with its leads on top of the newly applied solder. Heat is again applied using hot gas or a hot bar to remelt the newly applied solder.

Each step, particularly a heating step, in the removal and replacement process represents an opportunity to damage the PCB. Since the number of components packed in a PCB has increased significantly in recent years, the resultant cost from such damages has also increased significantly. Thus, it is desirable to reduce the number of steps and the cycle time for the steps, particularly the number of heating steps and the heating cycle time. As will be described, the method of the present invention replaces a TAB component with reduced number of steps and cycle time for the steps, thereby reducing the opportunities for damaging the PCB.

SUMMARY OF THE INVENTION

A method for replacing a tape automated bonding (TAB) component on a printed circuit board (PCB) is disclosed which as particular application to repairing PCB with TAB components, bonded using standard industrial grade solder. Under the preferred embodiment of the present invention, new standard industrial grade solder is applied to the leads of the TAB component to be replaced before the TAB component to be replaced is removed. The new solder is applied by dispensing soler paste on the leads using a syringe. The new solder is dispensed as solder beads at the end of the leads. Each solder bead has a diameter less than 33 mm.

The new solder and the old solder are melted at the time. The solder is melted by applying hot gas uniformly to the TAB component's leads. Concurrently, the TAB component to be replaced is removed by applying a lifting force. The lifting force is provided by a vacuum tip connected to the TAB component to be removed.

After applying flux to the solder pads, the replacing TAB component is then placed in position and connected to the PCB by applying pressure and heat to the replacing TAB component's leads and the remaining solder. A vacuum tip is used for picking and placing the replacing TAB component into position. A four sided heat bar is used to apply heat and pressure to the replacing component's leads and the remaining solder while the vacuum tip is still attached to the replacing TAB component. After melting the remaining solder, the four sided heat bar is allowed to cool below the melting temperature of the solder before being removed from the replacing component's leads.

As a result, the replacing TAB component is connected to the PCB with reduced number of steps and cycle time for the steps, thereby reducing the opportunities for damaging the PCB.

BRIEF DESCRIPTION OF THE DRAWINGS

The features and advantages of the present invention will be apparent from the following detailed description of the preferred embodiment of the invention with references to the drawings in which.

DETAILED DESCRIPTION OF THE INVENTION

A method for replacing a tape automated bonding (TAB) component on a printed circuit board (PCB) is disclosed which as particular application to repairing PCB with TAB components bonded using standard industrial grade solder. In the following description for purposes of explanation, specific numbers, materials and configurations are set forth in order to provide a thorough understanding of the present invention. However, it will be apparent to one skilled in the art the present invention may be practiced without the specific details. In other instances, well known systems are shown in diagrammatical or block diagram form in order not to obscure the present invention unnecessarily.

Figure 1A:
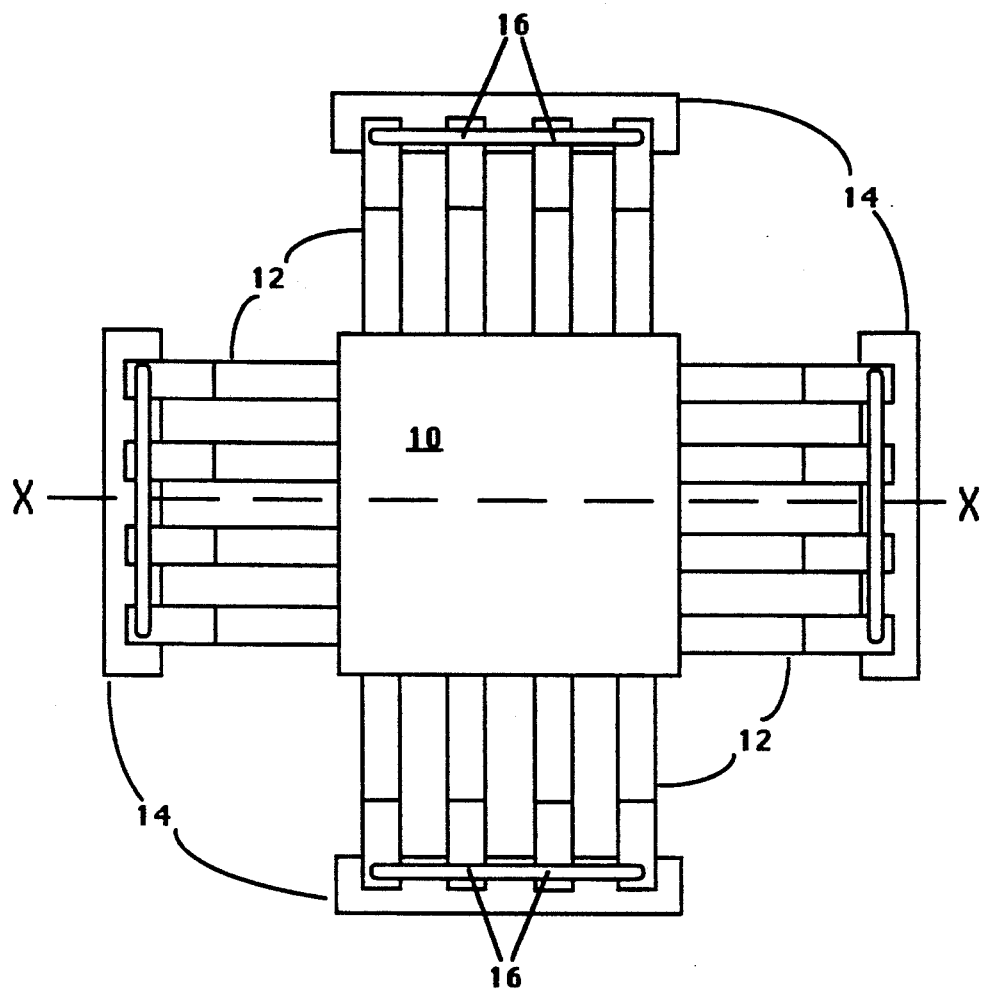
FIGS. 1a and 1b are top and side views of a TAB component to be replaced having new solder applied as solder beads at the ends of the TAB component's leads per the teachings of the present invention.
Figure 1B:
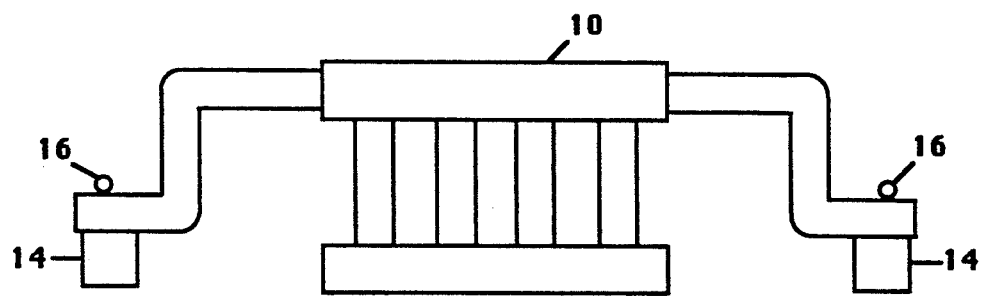

Referring first to FIGS. 1a and 1b which show a top view and a side view of a TAB component to be replaced having new solder applied as solder beads at the ends of the TAB component's leads per the teachings of the present invention. The TAB component to be replaced 10 comprises of a plurality of leads 12. The TAB component to be replaced 10 is connected to the solder pads 14 of the PCB by old standard industrial grade solder (not shown) previously applied to the leads 12. Standard industrial grade solder is composed of approximately 63% Tin and 37% Lead. Its melting temperature, heating and cooling characteristics are well known, and will not be described further. To remove the TAB component from the PCB, new standard industrial grade solder is first applied to the end of each lead 12 of the TAB component 10. In its presently preferred form, the new solder are applied as solder beads 16 with a diameter not greater than 33 mm. The solder beads 16 are applied to the ends of the leads 12 using a syringe (not shown), which is well known in art.

Figure 2:
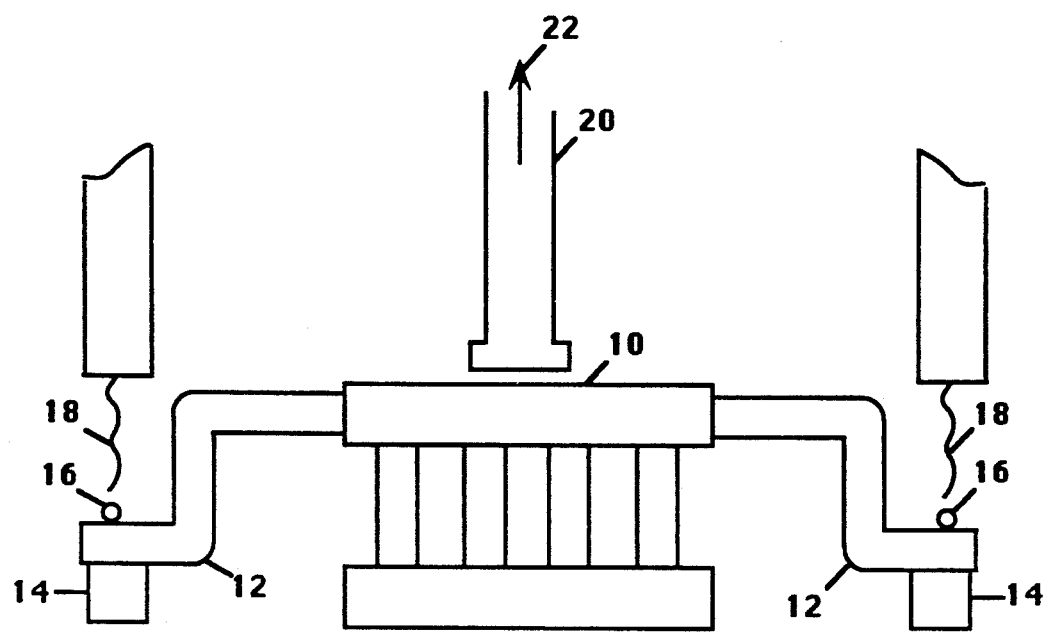
FIG. 2 is a cross-sectional view along the X—X axis of FIG. 1 of the TAB component to be replaced being removed per the teachings of the present invention.

Referring now to FIG. 2 which shows a cross-sectional view along the X—X axis of FIG. 1 of the TAB component to be replaced being removed per the teachings of the present invention. Both the new solder 16 and the old solder (not shown) are melted by applying hot gas 18 to the solder. After melting the solder, the TAB component to be replaced 10 is removed by applying a lifting force 22. In its presently preferred form, the lifting force 22 is applied by connecting a vacuum tip 20 to the TAB component to be removed.

Figure 3:
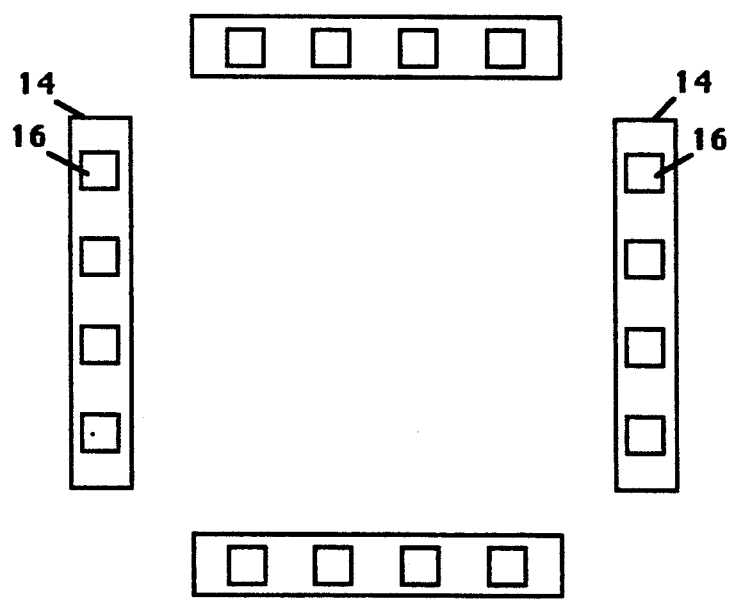
FIG. 3 is a top view of the TAB component site after the TAB component to be replaced has been removed per the teachings of the present invention.

Referring now to FIG. 3 which shows a top view of the TAB component site after the TAB component to be replaced has been removed per the teachings of the present invention. The TAB components to be replaced is removed by the lifting force in a manner such that not all the new solder 16 are removed with the removed TAB component.

Figure 4:
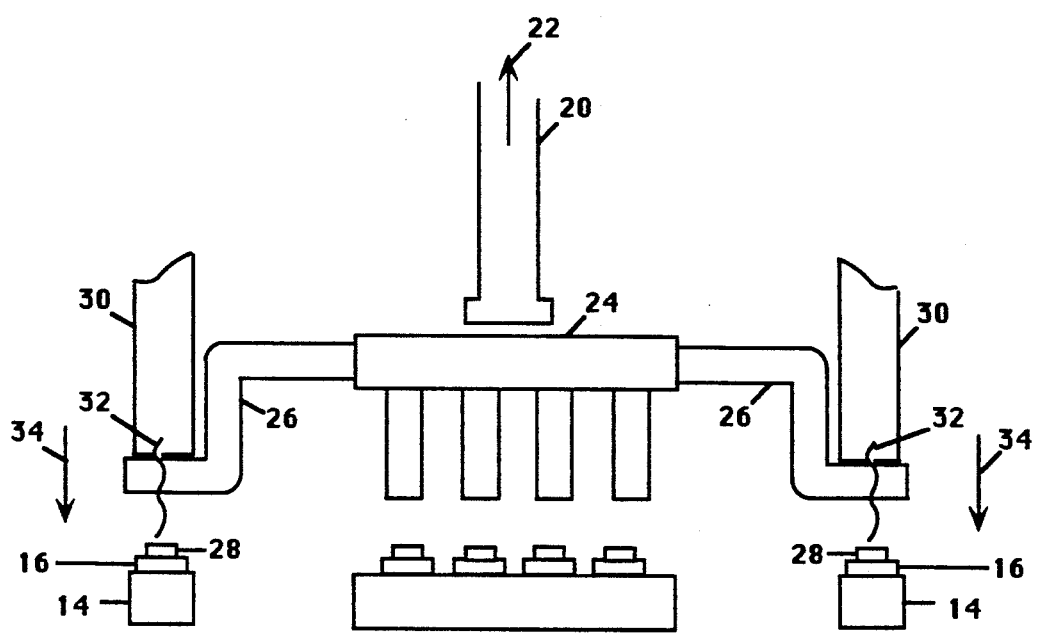
FIG. 4 is a cross section view along the X—X axis of FIG. 1 of the replacing TAB component being placed onto the TAB component site, and connected to the PCB per the teachings of the present invention.

Referring now to FIG. 4 which shows a cross section view along the X—X axis of FIG. 1 of the replacement TAB component being placed in the TAB component site, and connected to the PCB per the teachings of the present invention. Before placing the replacement TAB component 24 onto the TAB component site, flux 28 is applied to the solder pads 14 of the PCB. The replacement TAB component 24 is then picked up and placed onto the TAB component site by applying a lifting force 22 to the replacement TAB component 24. In its presently preferred form, similarly, the lifting force 22 is applied by connecting a vacuum tub 20 to the replacement TAB component 24.

While the replacement TAB component 24 is being picked up and placed over the TAB component site, heat 32 is applied to the leads 26 of the replacement TAB component 24. In its presently preferred form, the heat 32 is applied by applying a four-sided heat bar 30 to the leads 26 of the replacement TAB component 24. After the replacement TAB component 24 is placed onto the TAB component site, pressure 34 is applied to the leads 26 forcing them to make contact with the solder pads 14. In its presently preferred form, the pressure 34 is also applied using the four-sided heat bar 30.

After the leads 26 are forced to make contact with the solder pads 14, heat 32 is withdrawn from the four-sided heating bars 30, and the remaining new solder 16, the flux 28, the leads 26 and the heating bar 30 are allowed to cool. The pressure 34 from the heating bar 30 is maintained while the heating bar 30 is allowed to cool. The heating bar 30 is removed after it has cooled below the melting temperature of the solder.

As a result, the replacement TAB component 24 is connected to the solder pads 14 of the PCB by the remaining new solder 16. It will be appreciated that as compared to the prior art, there are less steps to be performed to replace a TAB component under the teachings of the present invention. Furthermore, experience has shown that the cycle time for the steps, particularly the heating cycle time, as compared to the prior art, are also reduced under the teachings of the present invention. Therefore, the opportunity for damaging the PCB is reduced.

While the method of the present invention has been described in terms of its presently preferred form, those skilled in the art will recognize that the method of the present invention is not limited to the presently preferred form described. The method of the present invention may be practiced with modification and alteration within the spirit and scope of the appended claims.

What is claimed is:

1. A method for replacing a tape automated bonding (TAB) component on a printed circuit board (PCB) that reduces opportunities for damaging said PCB, said method comprising the steps of:

applying new solder to leads of said TAB component, said TAB component comprising a plurality of leads, and being connected to a plurality of solder pads of said PCB by old solder previously applied to said leads, said old and new solder being standard industrial grade solder composed of approximately 63% Tin and 37% Lead, said PCB comprising a plurality of solder pads;

melting said new and old solder at the same time;

removing said TAB component without removing all of said new solder by applying a lifting force, lifting force being applied while said new and old solder are being melted at the same time;

applying flux to said solder pads;

placing a replacement TAB component onto said PCB where said TAB component to be replaced was removed with leads of said replacement TAB component resting on said solder pads, said replacement TAB component also comprising a plurality of leads; and applying heat and pressure to the remaining new solder and said leads of said replacement TAB component while said replacement TAB component is being placed onto said PCB to connect said replacement TAB component to said solder pads of said PCB;

whereby causing said replacement TAB component to be connected to said PCB with reduced number of steps and cycle time for the steps, thereby reducing opportunities to damage said PCB.

2. The method as set forth in claim 1, wherein each of said leads of said TAB component to be removed has an end, and said new solder is applied as solder beads on said ends.

3. The method as set forth in claim 2, wherein each of said solder bead has a diameter not greater than 33 mm.

4. The method as set forth in claim 2, wherein said new solder are applied using a syringe.

5. The method as set forth in claim 1, wherein said new and old solder are melted at the same time by hot gas.

6. The method as set forth in claim 1, wherein said lifting force is provided to said TAB component to be replaced by a vacuum tip connected to said TAB component to be replaced.

7. The method as set forth in claim 1, wherein said replacement TAB component is placed onto said PCB where said TAB component to be replaced was removed using a vacuum tip connected to said replacement TAB component.

8. The method as set forth in claim 1, wherein said heat and pressure is applied to the remaining solder and said leads of said replacement TAB component using a four sided heat bar.

9. The method as set forth in claim 8, wherein said four sided heat bar is allowed to cool below the melting temperature of said remaining solder before being removed.

* * * * *